(12) United States Patent
Aruga et al.

(10) Patent No.: US 8,481,607 B2
(45) Date of Patent: Jul. 9, 2013

(54) SURFACE-TREATMENT METHOD FOR A FLUORORESIN MOLDED BODY, AND FLUORORESIN MOLDED BODY

(75) Inventors: Hiroshi Aruga, Tokyo (JP); Koichi Oda, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/558,547

(22) Filed: Jul. 26, 2012

(65) Prior Publication Data

US 2012/0296002 A1    Nov. 22, 2012

Related U.S. Application Data

(63) Continuation of application No. PCT/JP2011/051654, filed on Jan. 27, 2011.

(30) Foreign Application Priority Data

Jan. 29, 2010    (JP) .................................. 2010-018627

(51) Int. Cl.
  *C08F 2/46*    (2006.01)
(52) U.S. Cl.
  USPC ............... 522/156; 522/1; 522/155; 528/401; 528/480; 528/503; 428/421
(58) Field of Classification Search
  USPC .................. 522/1, 150, 155, 156; 428/411.1, 428/421; 528/397, 401, 480, 481, 503
  See application file for complete search history.

(56) References Cited

U.S. PATENT DOCUMENTS 5,968,377 A    10/1999    Yuasa et al.

FOREIGN PATENT DOCUMENTS

| JP | 60-016345 | 4/1985 |
|----|-----------|--------|
| JP | 63-009533 | 1/1988 |
| JP | 10-154598 | 6/1998 |
| JP | 11-043781 | 2/1999 |
| JP | 11-209487 | 8/1999 |
| JP | 3040358   | 3/2000 |
| JP | 2001-345278 | 12/2001 |
| JP | 2002-020514 | 1/2002 |
| JP | 2003-201570 | 7/2003 |

OTHER PUBLICATIONS

Machine translation of JP 2002-020514.*
International Search Report issued Apr. 26, 2011 in PCT/JP2011/051654 filed Jan. 27, 2011.

* cited by examiner

*Primary Examiner* — Frances Tischler
(74) *Attorney, Agent, or Firm* — Oblon, Spivak, McClelland, Maier & Neustadt, L.L.P.

(57) ABSTRACT

A surface treatment method for a fluororesin molded body, which is a method for treating a surface of an ETFE molded body by using a glow discharge generated by a pulsed electric field having a voltage-rising time of at most 10 μsec in a nitrogen atmosphere under a pressure in the vicinity of atmospheric pressure;
which comprises carrying out a plurality of glow discharge treatments at intervals of at least 0.01 sec so that the discharge density of each of the glow discharges is from 40 to 200 W·min/m$^2$, and that the total discharge density of the glow discharges is from 220 to 800 W·min/m$^2$. Further, an ETFE molded body subjected to a surface treatment by the surface treatment method.

5 Claims, 2 Drawing Sheets

SURFACE-TREATMENT METHOD FOR A FLUORORESIN MOLDED BODY, AND FLUORORESIN MOLDED BODY

TECHNICAL FIELD

The present invention relates to a surface-treatment method for a fluororesin molded body, and a fluororesin molded body applied with a surface treatment by the treatment method.

BACKGROUND ART

An ethylene-tetrafluoroethylene copolymer (ETFE) is excellent in non-tackiness, pollution resistance, transparency, chemical resistance, weather resistance and heat resistance, and thus, is widely employed for various applications. For example, for a wall paper or a surface material of kitchen door, a composite sheet is employed, which is formed by laminating an ETFE film with a thermoplastic plastic sheet such as a vinyl chloride resin sheet or a polyethylene sheet or a thermosetting polyester sheet via an adhesive agent. For a surface material of a gas range hood or a kitchen wall panel, a material produced by laminating a painted metal plate with an ETFE film via an adhesive agent, is employed. Further, a tube made of an ETFE covered with a rubber, an urethane resin, a nylon resin etc. via an adhesive agent, is employed as a tube for fuel, excellent in barrier property against gasoline and durability.

In particular, in recent years, weather resistance of ETFE draws an attention, and instead of glasses, ETFE films are used as surface materials of flexible solar cells. Such an ETFE film employed as a surface member of a solar cell is thermally laminated at a temperature of from 135 to 160° C. with a material such as an ethylene-vinyl acetate copolymer (EVA), a modified polyethylene or a polybutylvinylal (PVB) that are materials for wrapping a solar cell, without using an adhesive agent.

When an ETFE molded body is adhered to e.g. a plastic sheet or a metal plate to form a laminate and when a surface of the molded body is printed with a printing ink, the molded body is applied with a surface treatment in order to improve adhesion to other members or other components.

As such a surface treatment to a fluororesin molded body, for example, a treatment using a corona discharge in the air is described in Patent Documents 1 and 2. However, by the surface treatment using a corona discharge, it is difficult to sufficiently improve the adhesion of the ETFE molded body to other materials or other components. Further, even if the adhesion of the ETFE molded body is improved just after the treatment, the adhesion cannot be maintained for a long time.

Meanwhile, Patent Document 3 shows a method of applying a surface treatment to a polyethylene terephthalate (PET) film by using a glow discharge produced by a pulsed electric field under predetermined conditions. Further, Patent Document 4 shows a method of applying a surface treatment to a polytetrafluoroethylene (PTFE) film by using a glow discharge produced by a pulsed electric field under predetermined conditions. However, even by applying the surface treatment described in Patent Document 3 or 4, it has been difficult to improve the adhesion of an ETFE molded body to other members and to maintain the adhesion for a long time.

PRIOR ART DOCUMENTS

Patent Documents
  Patent Document 1: JP-B-60-16345
  Patent Document 2: JP-A-63-9533
  Patent Document 3: Japanese Patent No. 3040358
  Patent Document 4: JP-A-2002-20514

DISCLOSURE OF INVENTION

Technical Problem

It is an object of the present invention to provide a surface treatment method, which improves the adhesion of an ETFE molded body to other members such as a plastic sheet or a metal or other components such as adhesive agents or printing inks, and which can maintain the adhesion for a long time.

Further, it is another object of the present invention to provide an ETFE molded body, which is excellent in adhesion to other members such as plastic sheets or metals or other components such as adhesive agents or printing inks, and which has an excellent durability capable of maintaining the adhesion for a long time.

Solution to Problem

The present invention employs the following constructions in order to solve the above problems.

[1] A surface treatment method for a fluororesin molded body, which is a method for treating a surface of a fluororesin molded body containing an ethylene-tetrafluoroethylene copolymer by using a glow discharge generated by a pulsed electric field having a voltage-rising time of at most 10 μsec in a nitrogen atmosphere under a pressure in the vicinity of atmospheric pressure;

which comprises carrying out a plurality of glow discharge treatments at intervals of at least 0.01 sec in a nitrogen atmosphere wherein the oxygen concentration is adjusted to be at most 100 ppm, so that the discharge density of each of the glow discharges is from 40 to 200 W·min/m$^2$, and that the total discharge density of the glow discharges is from 220 to 800 W·min/m$^2$.

[2] The surface treatment method for a fluororesin molded body according to the above [1], wherein the molar ratio of ethylene/tetrafluoroethylene in the ethylene-tetrafluoroethylene copolymer is from 30/70 to 70/30.

[3] The surface treatment method for a fluororesin molded body according to the above [1] or [2], wherein the frequency of the pulsed electric field is from 0.5 to 100 kHz.

[4] A fluororesin molded body containing an ethylene-tetrafluoroethylene copolymer, which is applied with a surface treatment by the surface treatment method as defined in any one of the above [1] to [4], and wherein the following fluorine transfer amount (F/Al) is at most 0.5:

(fluorine transfer amount (F/Al))

The fluorine transfer amount (F/Al) is defined as a ratio of fluorine atoms (atomic %) to aluminum atoms (atomic %) obtained by pressing an aluminum thin plate of 100° C. against a surface of the fluororesin molded body with a surface pressure of 21 kgf/cm$^2$ for 10 minutes, cooling the aluminum thin plate to a room temperature, separating the aluminum thin plate, and analyzing the surface of the aluminum thin plate by X-ray photoelectron spectrometry (ESCA).

Advantageous Effects of Invention

With the surface treatment method of the present invention, it is possible to obtain an ETFE molded body excellent in adhesion to other members such as plastic sheets or metals or other components such as adhesive agents or printing inks, which has an excellent durability capable of maintaining the adhesion for a long time.

Further, the ETFE molded body of the present invention is excellent in adhesion with other members such as plastic sheets or metals or other components such as adhesive agents or printing inks, and which has an excellent durability capable of maintaining the adhesion for a long time.

DESCRIPTION OF EMBODIMENTS

The surface treatment method for a fluororesin molded body of the present invention is a method for improving the property of a surface of a fluororesin molded body containing ETFE (hereinafter referred to as "ETFE molded body"). The surface treatment method of the present invention will be described in detail, showing an example of an embodiment.
(Surface Treatment Apparatus)

Figure 1:
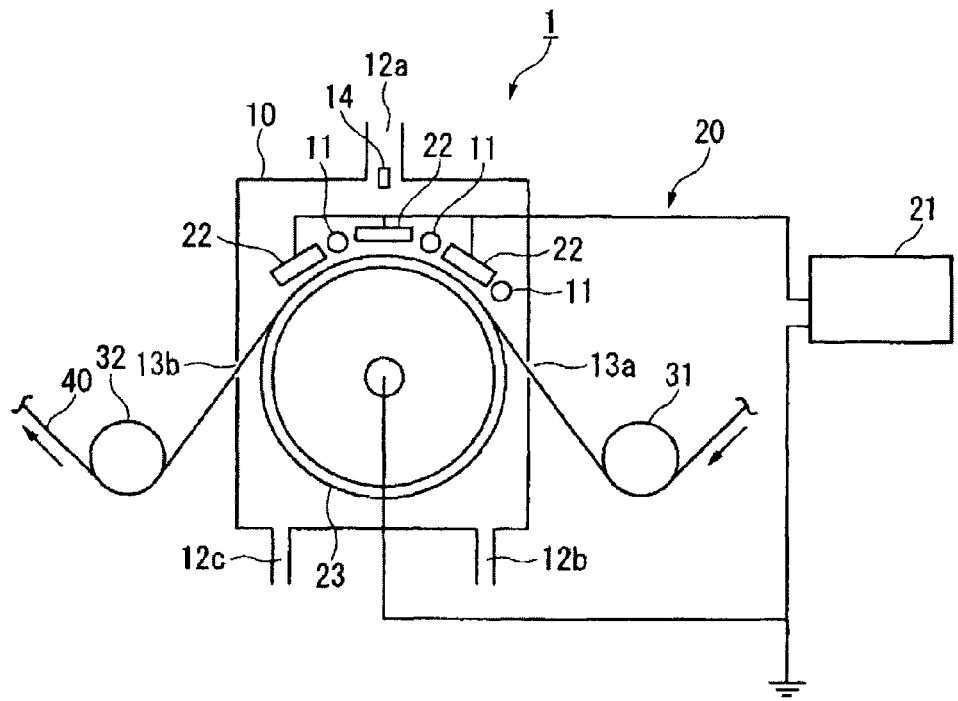
FIG. 1 is a schematic view showing an example of an embodiment of a surface treatment apparatus applicable to the surface treatment method of the present invention.

FIG. 1 is a schematic view of a surface treatment apparatus 1 for applying a surface treatment to an ETFE film by glow discharges.

The surface treatment apparatus 1 has, as shown in FIG. 1, a surface treatment unit 10, a discharge means 20 for generating glow discharges in the surface treatment unit 10, guide rolls 31, 32 for guiding an ETFE film 40 into the surface treatment unit 10.

The surface treatment unit 10 is provided with three gas introduction ports 11 for introducing nitrogen gas into the surface treatment unit 10, three gas discharge ports 12a, 12b and 12c for discharging a gas from the surface treatment unit 10, a film entrance 13a for feeding the ETFE film 40 into the surface treatment unit 10, and a film exit 13b for pulling out the ETFE film 40 from the surface treatment unit 10. The gas discharge port 12a is provided in the upper portion of the surface treatment unit 10, and an oxygen concentration meter 14 for measuring the oxygen concentration in the surface treatment unit 10 is provided. The gas discharge ports 12b and 12c are each provided in the lower portion of the surface treatment unit 10.

The discharge means 20 has a high frequency power supply 21, three discharge electrodes 22 and an opposing electrode 23. They are electrically connected, and earth connection is provided to a wire between the high frequency power supply 21 and the opposing electrode 23. The three discharge electrodes 23 and the three gas introduction ports 11 are provided alternately along the outer periphery of the opposing electrode 23. By applying a voltage between each discharge electrode 22 and the opposing electrode 23, a glow discharge is generated.

The ETFE film 40 is supported by a guide roll 31, the opposing electrode 23 and a guide roll 32, and while guided by these members, the ETFE film 40 is pulled through the film entrance 13a into the surface treatment unit 10 and pulled out from the surface treatment unit 10 through the film exit 13b.

The discharge electrodes 22 are flat plate-shaped electrodes.

As the material of the discharge electrodes 22, a metal such as copper or aluminum, or a an alloy such as a stainless steel, a brass or a carbon steel, is mentioned. Each of the discharge electrodes 22 is preferably provided with a solid dielectric body on a surface facing to the opposing electrode 23 in order to facilitate generation of glow discharge.

As the solid dielectric body, a synthetic resin such a polytetrafluoroethylene or a polyethylene terephthalate, a glass, a metal oxide such as silicon dioxide, aluminum oxide, zirconium dioxide or titanium dioxide, a complex oxide such as barium titanate, or a silicon rubber, may be mentioned. Among them, a solid dielectric body made of titanium dioxide, zirconium dioxide or barium titanate having a specific dielectric constant of at least 10 (in 25° C. environment) is preferred, and titanium dioxide or zirconium dioxide is more preferred.

The shape of the solid dielectric body is not particularly limited, and it may be a film shape or a sheet shape, and in a case of metal oxide, the solid dielectric body is formed as a thin film.

Titanium dioxide is known as a ferroelectric substance, and its specific dielectric constant in a case of monocomposition containing no other components depends on the crystal structure. For example, the specific dielectric constant of titanium dioxide having a rutile type crystal structure is about 80. Further, the specific dielectric constant of a dielectric body containing other components depends on the purity and crystallinity of titanium dioxide. For example, in a case of a mixed composition containing at least one type of oxide of a metal such as Ba, Sr, Pb, Ca, Mg or Zr in titanium dioxide, a dielectric body having a specific dielectric constant of about from 2,000 to 18,500 depending on the purity and crystallinity, is obtained.

Since titanium dioxide having a monocomposition easily undergoes composition change in a heated environment, its handling environment is limited, and handling of titanium dioxide in a case of forming a thin film on an electrode is difficult. For this reason, in a case of employing titanium dioxide for a solid dielectric body, from the viewpoint of improving thermal stability, it is preferred to employ a mixture containing from 5 to 50 mass % of titanium dioxide and from 50 to 95 mass % of aluminum oxide, and it is more preferred to employ a mixture containing from 10 to 30 mass % of titanium dioxide and from 70 to 90 mass % of aluminum oxide.

Zirconium dioxide having a monocomposition has a dielectric constant of about 12, and is advantageous for generating glow discharge at a low voltage. In order to prevent expansion and shrinkage due to crystal change to stabilize zirconium dioxide, it is possible to add yttrium oxide ($Y_2O_3$), calcium oxide ($CaCO_3$), magnesium oxide (MgO) etc. to zirconium dioxide. In this case, the specific dielectric constant of zirconium dioxide depends on the type and crystallinity of the additive. In a case of employing zirconium dioxide to which an additive is added, in order to avoid deterioration of acid resistance or alkali resistance, it is preferred to make the amount of additive to be at most 30 mass %. For example, a solid dielectric body containing from 80 to 96 mass % of zirconium dioxide and from 4 to 20 mass % of yttrium oxide, has a specific dielectric constant of about from 8 to 16.

The thickness of the solid dielectric body provided on the discharge electrode 22 is appropriately determined depending on the thickness of an ETFE molded body to be treated and application voltage, and it is preferably from 10 to 4,000 μm. As the thickness of the solid dielectric body becomes thinner, it becomes easy to generate a glow discharge with lower voltage. As the thickness of the solid dielectric body becomes thicker, it becomes easy to suppress generation of arc discharge due to dielectric breakdown.

Further, in a case of forming the solid dielectric body as a thin film of metal oxide, the thickness of the film is preferably from 10 to 2,000 μm, more preferably from 500 to 1,500 μm. As the above film becomes thinner, it becomes easy to generate a glow discharge at low voltage, and it becomes easy to suppress rising the temperature of the ETFE film 40. Further, as the film becomes thinner, a crack tends to be formed in the film. As the above film becomes thicker, it becomes easy to suppress generation of arc discharge due to dielectric breakdown. Further, the thickness of the film of the metal oxide is preferably uniform from the viewpoint of stably carrying out surface treatment by glow discharge.

The opposing electrode 23 is a roll-shaped electrode.

As the material of the opposing electrode 23, a metal such as copper, aluminum or a stainless steel is mentioned. The opposing electrode 23 is preferably provided with a solid dielectric body on a surface facing to each discharge electrode 22 in order to facilitate glow discharge. The solid dielectric body is preferably provided on any one of each discharge electrode 22 and the opposing electrode 23 in order to facilitate glow discharge, particularly preferably provided on both of each discharge electrode 22 and the opposing electrode 23.

As the solid dielectric body, one mentioned for the discharge electrodes 22 is mentioned. Among them, the solid dielectric body to be provided on the opposing electrode 23 is preferably a dielectric body made of a material such as a silicone rubber that has adhesion to the ETFE film, since the opposing electrode 23 of this embodiment supports the ETFE film 40 in the surface treatment unit 10.

The opposing electrode 23 is preferably provided with a cooling means for cooling the opposing electrode 23 itself in order to cool the ETFE film 40 supported by the opposing electrode 23. The cooling means may be any one which can cool the opposing electrode 23, and for example, a means for cooling the opposing electrode 23 by circulation water is mentioned.

The distance between each discharge electrode 22 and the opposing electrode 23 is preferably from 0.5 to 50 mm, more preferably from 1 to 10 mm. When the distance is at least 0.5 mm, it is easy to introduce the ETFE film 40 between each discharge electrode 22 and the opposing electrode 23. When the distance is at most 50 mm, it is easy to generate glow discharge.

The method for forming the solid dielectric body on a surface of each of the discharge electrodes 22 and the opposing electrode 23 may be a known method, and for example, in a case of forming a film of metal oxide, e.g. plasma-spraying method may be mentioned.

(Surface Treatment Method)

Now, a method for applying a surface treatment to an ETFE film 40 by glow discharge in the surface treatment apparatus 1 will be described.

In the surface treatment apparatus 1, a nitrogen gas is introduced from the gas introduction port 11 to make the inside of the surface treatment unit 10 to be a nitrogen atmosphere with a pressure in the vicinity of the atmospheric pressure, and an ETFE film 40 supported by a guide roll 31, the opposing electrode 23 and a guide roll 32 is pulled into the surface treatment unit 10 through the film entrance 13a. Then, a voltage is applied between each discharge electrode 22 and the opposing electrode 23, to generate a plasma of the nitrogen gas to generate glow discharge, thereby to apply a glow discharge treatment to a surface of the ETFE film 40 between each discharge electrode 22 and the opposing electrode 23.

The nitrogen gas in plasma state (nitrogen plasma) generated by glow discharge removes a part of fluorine atoms from ETFE present on a surface layer of the ETFE film 40, and introduces nitrogen functional groups such as amine groups into the portion. By this introduction of nitrogen functional groups, the wettability of a surface of the ETFE film 40 is improved, and the adhesion is improved.

The temperature of the atmosphere at the time of carrying out glow discharge, that is the temperature in the surface treatment unit 10, is not particularly limited, and it is preferably from 0 to 60° C., more preferably from 10 to 40° C.

The pressure in the surface treatment unit 10 is in the vicinity of the atmospheric pressure, and it is preferably from 500 to 800 Torr, more preferably from 700 to 780 Torr. When the pressure is at least 500 Torr, it is easy to prevent a gas other than the introduction gas from being mixed into the discharge portion. When the pressure is at most 800 Torr, it is easy to prevent nitrogen gases in plasma state from colliding each other to thereby prevent lowering of surface treatment effect to the film.

The atmosphere for the surface treatment of the present invention, that is the atmosphere in the surface treatment unit 10, is preferably a nitrogen atmosphere having an oxygen concentration of at most 100 ppm. When the oxygen concentration is at most 100 ppm, an ETFE film 40 capable of maintaining an excellent adhesion to other members or components for a long time, can be easily obtained by the surface treatment. The oxygen concentration is more preferably at most 90 ppm, still more preferably at most 60 ppm.

Here, into the surface treatment unit 10, nitrogen gas is introduced from the gas supply port 11, but instead of nitrogen gas, e.g. carbon dioxide gas or hydrogen gas may be introduced. Carbon dioxide gas functions as an oxygen supply source for introducing oxygen functional groups such as hydroxy groups to ETFE in a surface layer of the ETFE film 40. Hydrogen gas functions as a hydrogen supply source for introducing amino groups to ETFE in a surface layer of the ETFE film 40. Also by introduction of oxide functional groups into ETFE, the adhesion of the ETFE film 40 is improved in the same manner as the case of introducing nitrogen functional groups.

The total introduction amount of the carbon dioxide gas and the hydrogen gas based on 100 mol % of nitrogen gas is preferably at most 10 mol %, more preferably at most 5 mol %. When the total introduction amount of the carbon dioxide gas and the hydrogen gas based on 100 mol % of the nitrogen gas is at most 10 mol %, the adhesion of the ETFE film 40 after the surface treatment becomes excellent, and the adhesion can be maintained for still longer time.

The electric field to be applied between each discharge electrode 22 and the opposing electrode 23 is a pulsed electrode having a voltage rising time of at most 10 μsec (hereinafter referred to as "pulsed electric field"). When the voltage rising time is at most 10 μsec, it is possible to prevent the discharge state from changing to arc discharge, and to stably carry out a glow discharge treatment. The voltage rising time of the pulsed voltage is more preferably at most 5 μsec. As the voltage rising time becomes shorter, the gases are more efficiently ionized to be in plasma state, and glow discharge is more easily generated. Here, the voltage rising time means a time wherein the voltage change is continuously positive.

The voltage falling time of applied electric field is preferably short in the same manner as the voltage rising time, and it is preferred to set the rising time and the falling time to be the same. Here, the voltage falling time means a time wherein the voltage change is continuously negative.

The waveform of pulsed electric field is not particularly limited, and it may be an impulse waveform, a rectangular waveform or a modulated waveform. Further, when the frequency exceeds 20 kHz, the waveform tends to be a sine wave.

Figure 3A:
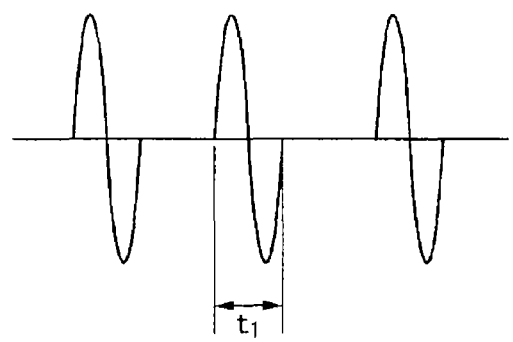
FIG. 3 is a view for illustrating a pulse duration time.
Figure 3B:
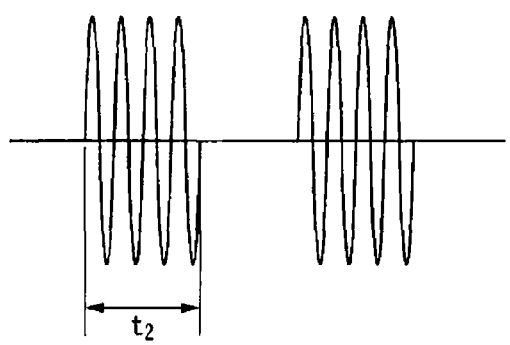

The pulse duration in the pulsed electric field is preferably from 0.5 to 200 μsec, preferably from 1 to 10 μsec. When the pulse duration is at least 0.5 μsec, discharge becomes more stable. When the pulse duration is at most 200 μsec, it is easy to suppress transition of glow discharge to arc discharge. Pulse duration can be adjusted by the frequency of pulsed electric field. Here, the pulse duration means a time wherein the pulse continues. For example, in a case of intermittent pulses wherein each pulse is isolated as shown in FIG. 3(A), the pulse duration $t_1$ is the same as the pulse width time. Further, in a case where a plurality of pulses are continuous as shown in FIG. 3(B), the pulse duration $t_2$ is the same as the total pulse width time of the series of continuous pulses.

The electric field intensity to be applied is preferably from 10 to 1,000 kV/cm, preferably from 100 to 300 kV/cm. When the electric field intensity is at least 10 kV/cm, the gas is easily put in a plasma state by glow discharge. When the electric field intensity is at most 1,000 kV/cm, it is easy to suppress generation of arc discharge.

The frequency of the pulsed voltage is preferably from 0.5 to 100 kHz, more preferably from 5 to 50 kHz. When the frequency of the pulsed voltage is at least 0.5 kHz, the discharge density of glow discharge increases to shorten a time required for surface treatment. When the frequency of the pulsed voltage is at most 100 kHz, it is possible to suppress transition of discharge state to arc discharge, and to carry out stable glow discharge.

In the treatment method of the present invention, a plurality of glow discharges are applied at intervals of at least 0.01 sec. In the surface treatment apparatus of this embodiment, the ETFE film 40 is conveyed while it is supported by the opposing electrode 23 to make it pass through a gap between the opposing electrode 23 and each of three discharge electrodes 22, thereby to apply three glow discharge treatments at intervals of at least 0.01 sec.

The discharge density of each glow discharge treatment, that is the discharge density between each discharge electrode 22 and the opposing electrode 23, is from 40 to 200 W·min/m², preferably from 60 to 180 W·min/m². When the discharge density of each glow discharge treatment is at least 40 W·min/m², nitrogen functional groups or oxygen functional groups are easily introduced, and adhesion of the ETFE film 40 is improved by the surface treatment. If the discharge density is less than the value, the number of the introduced functional groups is extremely small. When the discharge density of each glow discharge treatment is at most 200 W·min/m², it is possible to obtain an ETFE film 40 capable of maintaining adhesion for a long time by the surface treatment.

The discharge density is obtained by the following formula (1).

$$(\text{Discharge density}) = (I \times V)/(v \times d) \quad (1)$$

Here, in formula (1), "I" represents output current (unit: A) of the high frequency power supply 21, "V" represents output voltage (unit: V) of the high frequency power supply 21, "v" represents conveying speed (unit: m/min) of the ETFE film 40, and "d" represents treatment width that is the dimension in the width direction of the ETFE film 40 to be treated by the discharge electrode 22.

In the surface treatment apparatus 1, the electric power of the glow discharge generated between each discharge electrode 22 and the opposing electrode 23 is equal to the electric power to be input by the high frequency power supply 21. Accordingly, the discharge density of the glow discharge between each discharge electrode 22 and the opposing electrode 23 can be calculated according to the above formula (1) by using the output current I and the output voltage V of the high frequency power supply 21. For example, in a case of inputting an electric power with a voltage of 450 V and an electric current of 1.7 A by the high frequency power supply 21, at the time of glow discharge, an electric current of about 70 mA flows when the voltage between the electrodes is 11 kV.

The sum total of the discharge densities in the glow discharge treatment is from 220 to 800 W·min/m², preferably from 230 to 800 W·min/m². When the discharge density is at least 220 W·min/m², it is easy to introduce nitrogen functional groups or oxygen functional groups, and to improve adhesion of the ETFE film 40 by the surface treatment. When the discharge density is at most 800 W·min/m², an ETFE film 40 capable of maintaining the adhesion for a long time can be obtained.

Each interval between the glow discharge treatments is at least 0.01 sec, preferably at least 0.1 sec. By carrying out plurality of glow discharge treatments at intervals of at least 0.01 sec, it is possible to obtain an ETFE film 40 excellent in adhesion and capable of maintaining the adhesion for a long time. Even if the treatment interval is set to be a week or more, there is no adverse effect in the adhesion and its durability, but from the viewpoint of production efficiency, it is preferably at most 5 sec, more preferably at most 1 sec.

Further, from the viewpoint of easiness of obtaining an ETFE film excellent in adhesion and capable of maintaining the adhesion for a long time, the glow discharge treatment is preferably carried out while the temperature of the opposing electrode 23 is adjusted by a cooling means and the ETFE film 40 is cooled by the opposing electrode 23.

The temperature of the opposing electrode 23 is preferably from 0 to 25° C.

The ETFE film 40 to be applied with the surface treatment is a film formed of ETFE.

ETFE is a copolymer of ethylene (hereinafter referred to as "E") and tetrafluoroethylene (hereinafter referred to as "TFE").

The ratio (molar ratio) between repeating units based on TFE and repeating units based on E in the ETFE is preferably from 70/30 to 30/70, more preferably from 65/35 to 40/60, particularly preferably from 60/40 to 40/60.

Here, the ETFE may contain repeating units based on other monomers capable of performing copolymerization besides the repeating units based on E and TFE.

When the ETFE contains repeating units based on other monomers, the content of the repeating units based on other monomers is preferably at least 0.1 mol %, more preferably from 0.5 to 30 mol %, particularly preferably from 0.5 to 20 mol % based on all repeating units of the ETFE. When the content of repeating units based on the comonomers of the ETFE used in the present invention is in this range, it is possible to impart a function such as high solubility, water repellent property, oil repellent property, adhesion to a substrate, etc. without impairing the physical property of the ETFE.

As such other monomers, a fluoroolefin other than TFE, an olefin other than E or a vinyl monomer is mentioned.

As the fluoroolefin other than TFE, a $C_{2-3}$ fluoroolefin such as chlorotrifluoroethylene, hexafluoropropylene, vinylidene fluoride or vinyl fluoride, may be mentioned. Further, a fluorovinyl monomer such as (perfluoroalkyl)ethylene is mentioned.

As the olefin other than E, propylene or isobutylene may, for example, be mentioned.

As such a vinyl monomer, a vinyl ether, an allyl ether, a carboxylic acid vinyl ester or a carboxylic acid allyl ester may, for example, be mentioned.

As the vinyl ether, a cycloalkyl vinyl ether such as cyclohexyl vinyl ether; or an alkyl vinyl ether such as nonyl vinyl ether, 2-ethylhexyl vinyl ether, hexyl vinyl ether, ethyl vinyl ether, n-butyl vinyl ether or t-butyl vinyl ether; may, for example, be mentioned.

As the allyl ether, an alkyl allyl ether such as ethyl allyl ether or hexyl allyl ether may, for example, be mentioned.

As the carboxylic acid vinyl ester, vinyl ester of a carboxylic acid such as acetic acid, butyric acid, pivalic acid, benzoic acid or propionic acid, may, for example, be mentioned.

As the carboxylic acid allyl ester, an allyl ester of the above carboxylic acid may, for example, be mentioned. Further, a vinyl ester of a carboxylic acid having a branched alkyl group may be employed. Specifically, "Veova 9" or "Veova 10" (product name, manufactured by Shell Chemicals) may, for example, be mentioned.

The above copolymerizable monomer may be used alone or at least two types of such monomers may be used in combination.

Further, the ETFE film 40 may be constituted by ETFE alone or it may contain another fluororesin besides ETFE.

As such another fluororesin, a hexafluoropropylene-tetrafluoroethylene copolymer, a perfluoro(alkyl vinyl ether)-tetrafluoroethylene copolymer, a tetrafluoroethylene-hexafluoropropylene-vinylidene fluoride copolymer or a chlorotrifluoroethylene-ethylene copolymer may, for example, be mentioned. Further, the ETFE film 40 may contain a resin other than fluororesin.

One type of the above another fluororesin or the above resin other than fluororesin, may be used alone or at least two types of such resins may be used in combination.

When the ETFE film 40 contains the above another fluororesin or the above resin other than fluororesin, the content of ETFE is preferably at least 50 mass %.

Further, the ETFE film 40 may contain an additive or a filler such as a pigment, an UV absorber, a carbon black, a carbon fiber, a silicon carbide, a glass fiber, mica or a crosslinking agent.

The thickness of the ETFE film 40 is preferably from 10 to 300 μm, more preferably from 20 to 250 μm, particularly preferably from 25 to 200 μm. When the thickness is within this range, it is easy to handle the film at a time of surface treatment, and formation of wrinkles due to discharge can be reduced.

By the surface treatment method described above, it is possible to obtain an ETFE film 40 which is excellent in adhesion to other members such as plastic sheets or metals or other components such as adhesive agents or printing inks, and which has an excellent durability capable of maintaining the adhesion for a long time. Now, factors causing the improvement of adhesion and the improvement of its durability by the surface treatment method will be described.

The present inventors attempted to apply a conventional method of carrying out glow discharge treatment in nitrogen atmosphere to the surface treatment of ETFE molded body. However, by the conventional method, even if the adhesion temporarily improved, it was not possible to maintain the adhesion for a long time. Then, the inventors studied in further detail, and they have found that deterioration of adhesion is caused by the following factors.

Nitrogen gas requires higher voltage to be ionized into plasma state as compared with argon gas. Specifically, in order to generate a glow discharge in a nitrogen gas, a high voltage of higher than 11 kV is required. However, in conventional methods, by the surface treatment using a glow discharge produced by high voltage application, the temperature of an ETFE molded body rises, which tends to move low-molecular weight ETFE oligomers present in the ETFE molded body to the treatment surface. ETFE oligomers present in a surface layer come off the surface layer of the ETFE molded body at a temperature more than 80° C. Accordingly, even if nitrogen functional groups such as an amino groups are introduced into the ETFE oligomers that have moved to the surface layer of the ETFE molded body by the glow discharge treatment, and the adhesion just after the treatment becomes high, the adhesion is deteriorated by the come-off of the ETFE oligomers. In particular, in a constant-temperature constant-humidity test at 85° C. with a relative humidity of 85%, that is a common durability test, deterioration of adhesion due to come-off of ETFE oligomers was significant.

Further, in particular, if the glow discharge treatment by application of high voltage is conducted for at least three seconds, carbon-carbon bonds of the ETFE in the surface layer of the ETFE molded body are cut, whereby the molecular weight of the ETFE polymer is lowered. Also in this case, due to come-off of ETFE oligomers in low-molecular state, deterioration of adhesion occurs, whereby even if the adhesion is temporarily improved, it has not been possible to maintain the adhesion for a long time.

Thus, in conventional methods, the adhesion of the ETFE molded body temporarily improves by introduction of nitrogen functional groups, but since a large number of nitrogen functional groups are introduced into ETFE oligomers having low molecular weight, it has been difficult to maintain the adhesion for a long time. The above movement of ETFE oligomers to the surface layer by heat, and formation of ETFE oligomers by cut of carbon-carbon bonds, do not occur in a glow discharge at atmospheric pressure using e.g. an argon gas having a low discharge voltage, and such a phenomenon occurs uniquely in a glow discharge in a nitrogen atmosphere having a high discharge voltage.

On the other hand, in the surface treatment of the present invention, a plurality of glow discharge treatments having small discharge densities are carried out at intervals of at least a certain length. Accordingly, temperature rise of the ETFE molded body in each glow discharge treatment becomes small, and the ETFE molded body is cooled in each interval between the discharges. Accordingly, at the time of surface treatment, rise of the temperature of the ETFE molded body to a high temperature is prevented, and movement of ETFE oligomers to the surface layer due to the heat is suppressed. Moreover, since the discharge density of each glow discharge treatment and the sum total of these discharge treatments do not become excessive, the amount of ETFE oligomers produced by the cut of carbon-carbon bonds of the ETFE polymer in the surface layer is reduced. Accordingly, in the surface layer of the ETFE molded body, the amount of ETFE oligomers becomes small, whereby a large number of nitrogen functional groups are introduced into the ETFE polymer. Accordingly, in the surface treatment of the present invention, it is assumed that deterioration of adhesion due to come-off of ETFE oligomers is suppressed, whereby it is possible to maintain the excellent adhesion for a long time.

Further, according to the study of the present inventors, it has become clear that nitrogen atoms in plasma state produced by the glow discharge can remove low molecular weight ETFE oligomers from the surface layer of the ETFE molded body in the same manner as argon in plasma state.

Since nitrogen atoms in plasma state produced by corona discharge do not have the above removal effect, it is necessary to use a glow discharge in order to obtain the removal effect of ETFE oligomers.

Namely, the nitrogen plasma produced by glow discharge is considered to cause the following effects (A) to (B) to a surface of the ETFE molded body at the same time.

(A) Remove a part of fluorine atoms in the ETFE and introduce nitrogen functional groups such as amine groups to the portion.

(B) Cut e.g. carbon-carbon bonds of the ETFE to produce low molecular weight ETFE oligomers.

(C) Remove low molecular weight ETFE oligomers from the surface layer of the ETFE molded body.

In the surface treatment of the present invention, since a glow discharge treatment having a small discharge density is carried out in a nitrogen atmosphere, generation speed of ETFE oligomers by the effect (B) is slow. Further, since the ETFE oligomers are removed by the effect (C), introduction of nitrogen functional groups into the ETFE oligomers in the surface layer of the ETFE molded body is further suppressed, whereby the adhesion is considered to be maintained for a long time.

Further, it has become clear that an oxygen gas in plasma state produced by the same glow discharge does not have an effect of removing low molecular weight ETFE oligomers described in effect (C), and that as the oxygen concentration in a nitrogen atmosphere becomes high, the effect (C) by the nitrogen plasma becomes small. As the oxygen concentration in a nitrogen atmosphere in which glow discharge is produced becomes high, more oxygen functional groups are introduced into ETFE in the surface layer of the ETFE molded body, and wettability is significantly improved. However, as the oxygen concentration becomes high, the amount of ETFE oligomers in the surface layer increases, whereby it is considered to become difficult to maintain the adhesion for a long time. Further, also in a case of employing carbon dioxide gas or hydrogen gas, if the introduction amount of these gases exceeds 10 mol % based on 100 mol % of nitrogen gas, the effect of the effect (C) may be diminished.

Here, the surface treatment method of the present invention is not limited to the above-described method. For example, in order to improve the wettability index of a surface of an ETFE molded body, a pretreatment by glow discharge may be carried out in a nitrogen atmosphere having a high oxygen concentration. By carrying out the pretreatment, the wettability index of the ETFE molded body is significantly improved by introduction of oxygen functional groups, but the amount of ETFE oligomers in the surface layer increases. However, by subsequent surface treatment of the present invention, the ETFE oligomers in the surface layer are removed, whereby the adhesion can be maintained for a long time. In the case of carrying out pretreatment, the discharge density of the glow discharge treatment in the pretreatment is not included in the sum total of discharge densities of the present invention.

Figure 2:
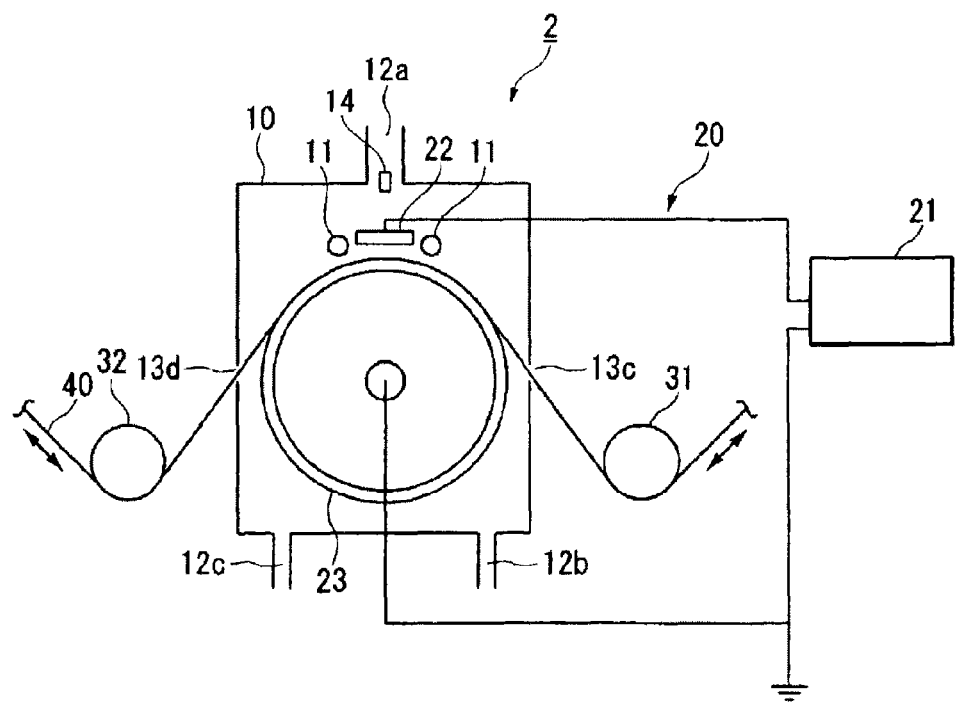
FIG. 2 is a schematic view showing an example of another embodiment of a surface treatment apparatus applicable to the surface treatment method of the present invention.

Further, the present invention is not limited to a method of employing the surface treatment apparatus 1, but a surface treatment apparatus 2 shown in FIG. 2 may be employed. The surface treatment apparatus 2 is the same as the surface treatment apparatus 1 except that the number of discharge electrode 22 in the discharge means 20 is one, that two gas introduction ports 11 are provided on both sides of the discharge electrode 22 and that two film entrance/exit ports 13c and 13d are provided in the surface treatment unit 10 so as to allow conveyance of the ETFE film 40 in two opposite directions. Portions of the surface treatment apparatus 2 common to those of the surface treatment apparatus 1 are represented by the same symbols and their explanation will be omitted.

In the surface treatment apparatus 2, it is possible to carry out a desired number of glow discharge treatments at intervals, for example, by repeating a step of carrying out a glow discharge treatment while the ETFE film 40 is conveyed in one direction and thereafter carrying out a glow discharge treatment while the film is conveyed in the opposite direction.

Further, in the surface treatment apparatuses 1 and 2, a roll-shaped electrode is employed as the opposing electrode, but the shape of electrode for generating glow discharge is not particularly limited, and an electrode having a known shape may be employed. For example, parallel flat plate type electrodes wherein the distance between the electrodes is constant, may be employed.

Further, the ETFE molded body to which the surface treatment is applied, is not limited to the above-described ETFE film, but it may, for example, be an ETFE having a sheet shape, a tube shape, a pipe shape or a fiber shape.

(ETFE Molded Body)

The ETFE molded body of the present invention is a molded body applied with a surface treatment by using a glow discharge by the above-mentioned surface treatment method of the present invention.

In the ETFE molded body after the surface treatment, duration of the adhesion becomes longer as the amount of ETFE oligomers in the surface layer, that easily come off, becomes smaller. Namely, as the amount of components easily come off from the surface layer (WBL (Weekly Boundary Layer)) becomes smaller, the adhesion can be maintained for longer time.

Accordingly, by measuring the WBL amount in the ETFE molded body after the surface treatment, it is possible to evaluate the durability capable of maintaining the adhesion for long time. Specifically, by measuring the fluorine transfer amount (F/AI) by the following method, the durability capable of maintaining adhesion for long time is measured.

An aluminum thin plate of 100° C. is pressed against a surface of the ETFE molded body with a surface pressure of 21 kgf/cm$^2$ for 10 minutes, they are cooled to a room temperature and thereafter, the aluminum thin plate is separated. Thereafter, the surface of the aluminum thin plate is analyzed by an X-ray photoelectron spectrometry (ESCA), and the ratio of fluorine atoms (atomic %) to aluminum atoms (atomic %) is designated as fluorine transfer amount (F/AI). By the ESCA, the amount of fluorine atoms transferred to the surface of the aluminum can be measured after the separation. The amount of fluorine atoms transferred to the aluminum surface measured after the separation, means the total amount of fluorine atoms contained in all compounds containing fluorine, that are transferred to the aluminum surface from the ETFE molded body.

The fluorine transfer amount (F/AI) of the ETFE molded body after the surface treatment is preferably at most 0.5, more preferably at most 0.3. When the fluorine transfer amount (F/AI) is at most 0.5, the excellent adhesion to other members such as plastics or metals or other components such as printing inks can be easily maintained for a long time.

Further, in e.g. a case of using an ETFE film as a cover film of a surface of a solar cell instead of a glass, the adhesion of the ETFE film to an EVA (ethylene-vinyl acetate copolymer film) for wrapping the solar cell, and its durability, are influenced by the amount of functional groups effecting the wettability index and the fluorine transfer amount (F/AI).

In cases of bonding with an EVA for a solar cell, lamination with a vinyl chloride resin sheet employing a polyester resin for dry laminate, or printing with an ink, the wettability index of the ETFE molded body (ETFE film) is preferably at least 34 dyne.

The wettability index is measured by the wettability test method according to JIS K6768.

The ETFE molded body applied with the surface treatment of the present invention, can be bonded with other members using various adhesive agents, and can be printed with various inks. The ETFE molded body of the present invention is excellent in adhesion to an adhesive agent or an ink, it can suppress deterioration of adhesion before there occurs separation caused by deterioration of the adhesive agent and the ink themselves due to hydrolysis or light deterioration due to e.g. ultraviolet rays.

As the adhesive agent, a polyester adhesive agent, an urethane adhesive agent, an epoxy adhesive agent, a nylon adhesive agent, an ethylene-vinyl acetate adhesive agent, an acryl adhesive agent or a rubber adhesive agent may, for example, be mentioned.

As the ink, an ink composed of a resin contained in the above adhesive agent, or an ink composed of a fluororesin may, for example, be mentioned.

Further, the ETFE molded body applied with the surface treatment, which has any one of a sheet shape, a film shape and a tube shape etc., is excellent in adhesion to other members such as a plastic sheet, and can form a laminate capable of maintaining the adhesion for a long time.

As such other members, a sheet, a film or a tube that are made of a soft vinyl chloride resin, a polyethylene resin, a polypropylene resin, a polycarbonate resin, an urethane resin, a nylon resin, an epoxy resin, a melamine resin or an acryl resin; or a metal plate such as a stainless steel plate, an aluminum plate, an iron plate or a galvalume steel plate, may, for example, be mentioned.

Lamination with such other members may be a lamination via an adhesive agent, and when such another member is a member having adhesiveness (for example, a member made of e.g. an ethylene-vinyl acetate resin, an urethane resin or a crosslinking rubber), it may be a laminate produced by a thermal press method.

EXAMPLES

Now, the present invention will be described in detail with reference to Examples and Comparative Examples. However, the present invention is not limited to the following descriptions.

[Evaluation Method]
(Wettability Index (Unit: Dyne, mN/m))

With respect to an ETFE film after the surface treatment, the wettability index was measured by using an wettability index reagent manufactured by Wako Pure Chemical Industries, Ltd. according to JIS K6768.

Specifically, the measurement was carried out in the following procedure.

The tip of a cotton swab is immersed in the wettability index reagent, and a line of the liquid was drawn on the surface-treated ETFE film by the tip of the cotton swab at a speed of about 5 cm/sec. The test was repeated while the reagent was changed from one having a small wettability index to one having a large wettability index, and the maximum value of the wettability index of the agent whereby the thickness of the liquid line did not change for 2 seconds after the line was drawn, was designated as the wettability index of the film.

(Fluorine Transfer Amount (F/Al))

Against the treatment surface of the surface-treated ETFE film, an aluminum thin plate of 100° C. was pressed with a surface pressure of 21 kgf/cm$^2$ for 10 minutes, they were cooled to a room temperature, and thereafter, the aluminum thin plate was separated, the surface of the aluminum thin plate was analyzed by an X-ray photoelectron spectrometry (ESCA), and the ratio of fluorine atoms (atomic %) to aluminum atoms (atomic %) was designated as fluorine transfer amount (F/Al).

For the measurement of ESCA, an X-ray photoelectron spectrometry apparatus of model 5500 manufactured by PHI Inc. was employed. As the X-ray source, a monochromic AlKa line at 14 kV and 500 W was used, the X-ray irradiation area was set to be 7 mm×2 mm, the analyzation area (photoelectron detection area) was set to be a circle of 0.8 mm in diameter, the photoelectron detection angle was set to be 70°, the neutralizing electron beam energy was set to be 0.1 eV, and the pass energy of photoelectron was set to be 23.5 eV.

(EVA (Ethylene-Vinyl Acetate Copolymer) Adhesion Test)

In order to evaluate adhesion of the surface-treated ETFE film to an EVA for a solar cell, a peeling strength (unit: N/cm) was measured by the following method.

The treatment surface of the surface-treated ETFE film was faced to an EVA for a solar cell (product name "W25CL", manufactured by Bridgestone Corporation) and they were subjected to a thermal press at 145° C. for 15 minutes. After they were left at a room temperature for one day, a peeling strength was measured with a peeling speed of 50 mm/min by the T-type peeling test according to JIS-K6854-3. Further, the remainder of the test piece was put in a constant-temperature constant-humidity bath of 85° C. and 85% RH for 3,000 hours, and the peeling strength was measured again.

(PET (Polyethylene Terephthalate) Laminate Test)

In order to evaluate the adhesion in a case of laminating the surface-treated ETFE film with a PET film, the peeling strength (unit: N/cm) was measured by the following method.

By using an urethane type adhesive agent, a laminate test of the surface-treated ETFE film with a PET film (product name "E-5100" (bonding-facilitating-treated), manufactured by Toyobo Co., Ltd.) of 50 μm thick was carried out. HD1013 (manufactured by Rock Paint) was employed as the main agent, H-62 (manufactured by Rock Paint) was employed as a curing agent, ethyl acetate was employed as a viscosity-adjusting agent, and they were mixed at a mass ratio of 10:1.5:5, and dried at 70° C. to obtain an adhesive agent. The adhesive agent was applied on the PET film so that the thickness of the adhesive agent became 5 μm, the PET film and the ETFE film were laminated by a laminate roll heated to be 60° C., and the laminate was cured at 60° C. for 2 days. Thereafter, the peeling strength was measured at a peeling speed of 50 mm/min by a T-type peeling test according to JIS-K6854-3. Further, the remainder of the test piece was put in a constant-temperature constant-humidity bath of 85° C. and 85% RH for 3,000 hours, and thereafter, the peeling strength was measured again.

(Overall Judgment)

Judgment of the surface-treated ETFE film was carried out according to the following criteria.

◦ (good): The initial peeling strength with EVA was at least 7 N/cm, and the peeling strength after 3,000 hours of constant-temperature constant-humidity test was at least 6 N/cm.

x (not good): The initial peeling strength with EVA was less than 7 N/cm, or the peeling strength after 3,000 hours of constant-temperature constant-humidity test was less than 6 N/cm.

Example 1

By using the surface treatment apparatus 2 shown in FIG. 2, a surface treatment of the ETFE film 40 by glow discharge was carried out. As the discharge electrode 22, an electrode was employed, which was prepared by forming a film (solid dielectric material) having a thickness of 0.5 mm composed of 13 mass % of titanium oxide and 87 mass % of aluminum oxide by a plasma spray method on a carbon steel plate having a dimension of 24 mm in the conveying direction of the ETFE film 40, a dimension of 650 mm in the width direction of the ETFE film 40 and a thickness of 10 mm. As the opposing electrode 23, a roll electrode was employed, which was prepared by coating the surface of a metal roll having a diameter of 30 cm with a silicone rubber having a thickness of 2 mm, and the roll temperature was maintained to be 15° C. by a circulation water. As a gas to be introduced from a gas introduction port 11, a nitrogen gas having a guaranteed purity of at least 99.99% was employed. As an oxygen concentration meter 14, a low concentration zirconia type oxygen concentration meter OX400 (manufactured by Yokogawa Electric Corporation) was employed. As the ETFE film 40, an ETFE film having a thickness of 25 μm and a width of 650 mm (manufactured by Asahi Glass Company, Limited) was employed.

The flow rate of nitrogen gas to be introduced was set to be 50 L/min in terms of the total flow rate introduced from all gas introduction ports 11, the nitrogen gas was introduced for 10 minutes and it was confirmed that the oxygen concentration became 88 ppm. Thereafter, while the nitrogen gas was introduced, the output voltage of a high frequency power supply 21 was set to be 450 V, the output current was set to be 1.7 A so that the treatment power became 765 W, and the ETFE film 40 was fed at 10 m/min, whereby a glow discharge treatment with a discharge density of 118 W·min/m² was carried out. The frequency was set to be 40 kHz. Accordingly, the waveform of pulsed electric field became one close to a rectangular wave. The voltage rising time was 1.5 μsec, the voltage falling time was 1.5 μsec and the pulse duration was 20 μsec. The voltage between the discharge electrode 22 and the opposing electrode 23 was 11.4 kV.

The discharge density was calculated according to the following formula (1).

$$(\text{Discharge density}) = (I \times V)/(v \times d) \quad (1)$$

Here, in formula (1), "I" represents the output current (unit: A) of the high frequency power supply 21, "V" represents the output voltage (unit: V) of the high frequency power supply 21, "v" represents the feeding speed (unit: m/min) of the ETFE film 40, and "d" represents the treatment width, that is the dimension in the width direction of the ETFE film 40 to be treated by the discharge electrode 22.

In the surface treatment, a glow discharge treatment while the ETFE film 40 was fed in one direction and a glow discharge treatment again while the ETFE film 40 was fed in the reverse direction, were repeated to carry out in total eight times of glow discharge treatments. Further, with respect to the ETFE film 40 after each glow discharge treatment, the wettability index, the fluorine transfer amount (F/Al) and the peeling strength of a laminate with EVA, were measured to evaluate the adhesion.

Example 2

The surface treatment was carried out in the same manner as Example 1 except that the conditions of the high frequency power supply 21 and the feeding speed of the ETFE film 40 were changed to change the discharge density to be 178 W·min/m² and to change the voltage rising time of the applied electric field to be 7 μsec, the oxygen concentration in the surface treatment unit 10 was set to be 56 ppm and that the number of treatments was changed to be in total 5 times, and the adhesion was evaluated.

Example 3

The surface treatment was carried out in the same manner as Example 1 except that the conditions of the high frequency power supply 21 and the feeding speed of the ETFE film 40 were changed to change the discharge density to be 284 W·min/m² and that the oxygen concentration in the surface treatment unit 10 was changed to 55 ppm and that the number of treatments was changed to be in total 3 times, and the adhesion was evaluated.

Example 4

The surface treatment was carried out in the same manner as Example 1 except that the conditions of the high frequency power supply 21 and the feeding speed of the ETFE film 40 were changed to change the discharge density to be 104 W·min/m² and to change the voltage rising time of the applied electric field to be 50 μsec, the oxygen concentration in the surface treatment unit 10 was changed to be 55 ppm and that the number of treatments was changed to be in total 4 times, and the adhesion was evaluated.

Example 5

The surface treatment was carried out in the same manner as Example 1 except that the conditions of the high frequency power supply 21 and the feeding speed of the ETFE film 40 were changed to change the discharge density to be 168 W·min/m², the oxygen concentration in the surface treatment unit 10 was changed to be 200 ppm and that the number of treatments was changed to be in total 3 times, and the adhesion was evaluated.

Example 6

A glow discharge treatment was carried out once as a pretreatment in the same manner as Example 1 except that the conditions of the high frequency power supply 21 and the feeding speed of the ETFE film 40 were changed to change the discharge density to be 168 W·min/m² and that the oxygen concentration in the surface treatment unit 10 was changed to be 200 ppm. Subsequently, a surface treatment constituted by in total three times (except for the pretreatment) of glow discharges was carried out in the same manner as Example 1 except that the discharge density was set to be 168 W·min/m² and the oxygen concentration in the surface treatment unit 10 was set to be 55 ppm. With respect to the ETFE film 40 after each glow discharge treatment, the wettability index, the fluorine transfer amount (F/Al) and the peeling strength of a laminate with EVA were measured to evaluate the adhesion.

Example 7

With respect to an ETFE film subjected to no surface treatment, the wettability index, the fluorine transfer amount (F/Al) and the peeling strength of a laminate with EVA were measured to evaluate the adhesion.

Table 1 shows treatment conditions of the surface treatments of Examples 1 to 7, and Table 2 shows the measurement results and the evaluation results of the ETFE films.

TABLE 1

| | | Film | | Treatment conditions | | | | | | | | |
|---|---|---|---|---|---|---|---|---|---|---|---|---|
| | | | | High frequency power supply 21 | | | Feeding | Discharge density [W·min/m²] | | Voltage-rising | Nitrogen gas | |
| | Type | Thickness [μm] | Number of treatments | Voltage [V] | Current [A] | Power [W] | speed [m/min] | Each treatment | Total | time [μsec] | Flow rate [L/min] | Oxygen concentration [ppm] |
| Ex. 1 | ETFE | 25 | 1-st | 450 | 1.7 | 765 | 10 | 118 | 118 | 1.5 | 50 | 88 |
| | | | 2-nd | 450 | 1.7 | 765 | 10 | 118 | 236 | 1.5 | 50 | 88 |
| | | | 3-rd | 450 | 1.7 | 765 | 10 | 118 | 354 | 1.5 | 50 | 88 |
| | | | 4-th | 450 | 1.7 | 765 | 10 | 118 | 472 | 1.5 | 50 | 88 |
| | | | 5-th | 450 | 1.7 | 765 | 10 | 118 | 590 | 1.5 | 50 | 88 |
| | | | 6-th | 450 | 1.7 | 765 | 10 | 118 | 708 | 1.5 | 50 | 88 |
| | | | 7-th | 450 | 1.7 | 765 | 10 | 118 | 826 | 1.5 | 50 | 88 |
| | | | 8-th | 450 | 1.7 | 765 | 10 | 118 | 944 | 1.5 | 50 | 88 |
| Ex. 2 | ETFE | 25 | 1-st | 385 | 1.2 | 462 | 4 | 178 | 178 | 7 | 50 | 56 |
| | | | 2-nd | 385 | 1.2 | 462 | 4 | 178 | 356 | 7 | 50 | 56 |
| | | | 3-rd | 385 | 1.2 | 462 | 4 | 178 | 534 | 7 | 50 | 56 |
| | | | 4-th | 385 | 1.2 | 462 | 4 | 178 | 712 | 7 | 50 | 56 |
| | | | 5-th | 385 | 1.2 | 462 | 4 | 178 | 890 | 7 | 50 | 56 |
| Ex. 3 | ETFE | 25 | 1-st | 385 | 1.2 | 462 | 2.5 | 284 | 284 | 1.5 | 50 | 55 |
| | | | 2-nd | 385 | 1.2 | 462 | 2.5 | 284 | 568 | 1.5 | 50 | 55 |
| | | | 3-rd | 385 | 1.2 | 462 | 2.5 | 284 | 852 | 1.5 | 50 | 55 |
| Ex. 4 | ETFE | 25 | 1-st | 450 | 0.9 | 405 | 6 | 104 | 104 | 50 | 50 | 55 |
| | | | 2-nd | 450 | 0.9 | 405 | 6 | 104 | 208 | 50 | 50 | 55 |
| | | | 3-rd | 450 | 0.9 | 405 | 6 | 104 | 312 | 50 | 50 | 55 |
| | | | 4-th | 450 | 0.9 | 405 | 6 | 104 | 416 | 50 | 50 | 55 |
| Ex. 5 | ETFE | 25 | 1-st | 450 | 1.7 | 765 | 7 | 168 | 168 | 1.5 | 50 | 200 |
| | | | 2-nd | 450 | 1.7 | 765 | 7 | 168 | 336 | 1.5 | 50 | 200 |
| | | | 3-rd | 450 | 1.7 | 765 | 7 | 168 | 504 | 1.5 | 50 | 200 |
| Ex. 6 | ETFE | 25 | Pretreatment | 450 | 1.7 | 765 | 7 | 168 | 168 | 1.5 | 50 | 200 |
| | | | 1-st | 450 | 1.7 | 765 | 7 | 168 | 168 | 1.5 | 50 | 55 |
| | | | 2-nd | 450 | 1.7 | 765 | 7 | 168 | 336 | 1.5 | 50 | 55 |
| | | | 3-rd | 450 | 1.7 | 765 | 7 | 168 | 504 | 1.5 | 50 | 55 |
| Ex. 7 | ETFE | 25 | | | | | No treatment | | | | | |

TABLE 2

| | | Film evaluation | | | | |
|---|---|---|---|---|---|---|
| | | Wettability | Fluorine transfer | EVA adhesion test peeling strength [N/cm] | | |
| | Number of treatments | index [dyne] | amount (F/Al) | Initial | After test | Total judgment |
| Ex. 1 | 1-st | 32 | 0.23 | 3.2 | 2.0 | x |
| | 2-nd | 36 | 0.23 | 7.2 | 7.3 | o |
| | 3-rd | 40 | 0.23 | 9.6 | 9.6 | o |
| | 4-th | 46 | 0.21 | 9.2 | 9.1 | o |
| | 5-th | 48 | 0.24 | 9.2 | 9.2 | o |
| | 6-th | 52 | 0.33 | 9.4 | 9.4 | o |
| | 7-th | 54 | 0.77 | 9.2 | 5.2 | x |
| | 8-th | 58 | 0.78 | 9.4 | 4.9 | x |
| Ex. 2 | 1-st | 32 | 0.22 | 6.6 | 6.5 | x |
| | 2-nd | 40 | 0.24 | 8.8 | 8.8 | o |
| | 3-rd | 46 | 0.32 | 9.2 | 9.2 | o |
| | 4-th | 52 | 0.33 | 9.2 | 8.8 | o |
| | 5-th | 56 | 0.69 | 7.5 | 4.6 | x |
| Ex. 3 | 1-st | 40 | 0.56 | 8.4 | 5.2 | x |
| | 2-nd | 46 | 0.78 | 9.4 | 5.1 | x |
| | 3-rd | 52 | 0.87 | 8.2 | 4.2 | x |
| Ex. 4 | 1-st | 32 | 0.56 | 8.4 | 4.2 | x |
| | 2-nd | 34 | 0.66 | 7.6 | 4.6 | x |
| | 3-rd | 38 | 0.58 | 8.0 | 5.6 | x |
| | 4-th | 44 | 0.68 | 7.0 | 4.9 | x |
| Ex. 5 | 1-st | 52 | 0.88 | 4.5 | 3.2 | x |
| | 2-nd | 54 | 1.25 | 4.5 | 2.6 | x |
| | 3-rd | 56 | 1.90 | 5.2 | 2.9 | x |
| Ex. 6 | Pre-treatment | 52 | 0.88 | 4.5 | 3.2 | x |
| | 1-st | 40 | 0.75 | 8.9 | 4.6 | x |
| | 2-nd | 44 | 0.38 | 8.5 | 8.6 | o |
| | 3-rd | 48 | 0.40 | 9.4 | 10.2 | o |
| Ex. 7 | No treatment | <32 | 0.20 | 0.1 | 0.1 | x |

As shown in Table 2, in the ETFE film of Example 1 to which a glow discharge treatment was carried out with a discharge density of 118 W·min/m², the adhesion to EVA was not excellent after the first treatment where the total of discharge densities was less than 220 W·min/m². However, after 2nd to 6th treatments whereby the total of discharge densities became at least 200 W·min/m², the wettability index became high, the fluorine transfer amount (F/Al) became small, and an excellent adhesion to EVA was obtained, and the adhesion was maintained for a long time as compared with the non-treated ETFE film of Example 7. After the seventh and eighth treatments whereby the total of discharge densities became more than 800 W·min/m², although the initial adhesion to EVA was excellent, the adhesion was deteriorated by the constant-temperature constant-humidity test.

Also in the ETFE film of Example 2 to which the glow discharge treatment was carried out with a discharge density of 178 W·min/m², except in the sample after the first and the fifth treatments whereby the total of discharge densities became less than 220 W·min/m² and more than 800 W·min/m², respectively, the samples showed high wettability indexes and small fluorine transfer amounts and these samples showed excellent adhesions to EVA and the adhesions were maintained for a long time.

In the ETFE film of Example 3 to which the discharge density in each glow discharge treatment exceeded 200 W·min/m$^2$, the fluorine transfer amount (F/AI) was large after each of first to third treatments and the initial adhesion to EVA was excellent, but the adhesion was deteriorated by the constant-temperature constant-humidity test.

In Example 4 in which the voltage rising time of electric field to be applied to the electrode exceeded 10 μsec, the fluorine transfer amount (F/AI) was large after each of the first to fourth treatments, and although the initial adhesion to EVA was excellent, the adhesion was deteriorated by the constant-temperature constant-humidity test.

In Examples 3 and 4, it is considered that since many low-molecular weight ETFE oligomers were present on the surface of the ETFE film after the treatment, the adhesion was deteriorated by come-off of the ETFE oligomers.

In Example 5 in which glow discharge treatment was applied in a nitrogen atmosphere having a high oxygen concentration, the wettability index of the ETFE film after the treatment was extremely high. However, the fluorine transfer amount (F/AI) was large after each of the first to fourth treatments, the initial adhesion was low, and the adhesion was deteriorated by the constant-temperature constant-humidity test. This is considered to be because high oxygen concentration diminished the effect of nitrogen atoms in plasma state for removing ETFE oligomers in the surface layer of ETFE film 40.

In Example 6, the ETFE film after the glow discharge treatment with an oxygen concentration of 200 ppm as the pretreatment, showed a significantly improved wettability index as compared with the ETFE film of Example 2 after the first treatment to which a glow discharge treatment with equivalent discharge density was applied. Thereafter, by carrying out glow discharge treatments of the present invention, the fluorine transfer amount (F/AI) was reduced, and after the second and third treatments whereby the total amount of discharge densities became at least 220 W·min/m$^2$, an excellent adhesion to EVA was obtained and the adhesion was maintained for a long time.

Example 8

By using the surface treatment apparatus 1 shown in FIG. 1, a surface treatment of the ETFE film 40 by glow discharge was carried out.

The surface treatment apparatus 1 was the same as the above surface treatment apparatus 2 except that the number of discharge electrodes 22 was 3 and the number of gas introduction ports 11 was 3. The intervals of three discharge electrodes 22 were each 10 cm. As a gas to be introduced from the gas introduction port 11, a nitrogen gas having a guaranteed purity of at least 99.99% was employed. As the ETFE film 40, an ETFE film (manufactured by Asahi Glass Company, Limited) having a thickness of 25 μm and a width of 650 mm was employed.

The flow rate of the nitrogen gas introduced was set to be 50 L/min in terms of the total flow rate of all introduction ports 11, the nitrogen gas was introduced at a flow rate of 50 L/min for 10 minutes, and it was confirmed that the oxygen concentration became 40 ppm. Thereafter, while the nitrogen gas was introduced, electric power is input from the high frequency power supply 21 with an output voltage of 590 V and an output current of 6.6 A (2.2 A for each pair of electrodes) so that the electric power became 3,894 W (1,298 W×3), and the feeding speed of the ETFE film 40 was set to be 35 m/min and the treatment interval wherein no glow discharge is conducted was set to be 0.17 sec to carry out three glow discharge treatments to constitute a surface treatment. The discharge density was 57 W·min/m$^2$ per each pair of electrodes, and the total of discharge density of three pairs of electrodes was 171 W·min/m$^2$. The frequency was set to be 30 kHz. Accordingly, the waveform of the pulsed electric field was close to a rectangular wave. The voltage rising time was set to be 1.5 μsec, the voltage falling time was set to be 1.5 μsec and the pulse duration was set to be 25 μsec.

With respect to the ETFE film 40 after the surface treatment, the wettability index, the fluorine transfer amount (F/AI) and the peeling strength of a laminate with EVA were measured to evaluate the adhesion.

Examples 9 to 15

The surface treatment was carried out in the same manner as Example 8 except that the conditions of the high frequency power supply 21 and the feeding speed of the ETFE film 40 were changed to change the discharge density of each discharge, the total of discharge densities and the treatment intervals as shown in Table 3, and the adhesion was evaluated. Further, with respect to ETFE films 40 of Examples 11, 12 and 14, a laminate test with an PET film was also carried out.

Examples 16 to 18

The surface treatment was carried out in the same manner as Example 8 except that the conditions of the high frequency power supply 21 and the feeding speed of the ETFE film 40 were changed so as to change discharge density of each discharge and the total of discharge densities and the treatment intervals as shown in Table 2, and that the oxygen concentration was set to be 55 ppm, and the adhesion was evaluated.

Table 2 shows treatment conditions of Examples 8 to 18, and Table 3 shows measurement results and evaluation results of ETFE films.

TABLE 3

| | | | High frequency power supply 21 | | | Feeding | Discharge density [W·min/m$^2$] | | Treatment interval [sec] | Voltage-rising time [μsec] | Nitrogen gas | |
|---|---|---|---|---|---|---|---|---|---|---|---|---|
| | | Film | | | | | | | | | | |
| | Type | Thickness [μm] | Voltage [V] | Current [A] | Power [W] | speed [m/min] | Each treatment | Total | | | Flow rate [L/min] | Oxygen concentration [ppm] |
| Ex. 8 | ETFE | 25 | 590 | 6.6 | 3894 | 35 | 57 | 171 | 0.17 | 1.5 | 50 | 40 |
| Ex. 9 | ETFE | 25 | 590 | 6.6 | 3894 | 30 | 67 | 201 | 0.20 | 1.5 | 50 | 40 |
| Ex. 10 | ETFE | 25 | 590 | 6.6 | 3894 | 25 | 80 | 240 | 0.24 | 1.5 | 50 | 40 |

TABLE 3-continued

| | | Film | High frequency power supply 21 | | | Treatment conditions | | | Voltage- | Nitrogen gas | |
| | | Thick- | | | | Feeding | Discharge density [W·min/m²] | | rising | | Oxygen |
| | Type | ness [μm] | Voltage [V] | Current [A] | Power [W] | speed [m/min] | Each treatment | Total | interval [sec] | time [μsec] | Flow rate [L/min] | concentration [ppm] |
|---|---|---|---|---|---|---|---|---|---|---|---|---|
| Ex. 11 | ETFE | 25 | 590 | 6.6 | 3894 | 20 | 100 | 300 | 0.30 | 1.5 | 50 | 40 |
| Ex. 12 | ETFE | 25 | 590 | 6.6 | 3894 | 15 | 133 | 399 | 0.40 | 1.5 | 50 | 40 |
| Ex. 13 | ETFE | 25 | 590 | 6.6 | 3894 | 10 | 200 | 600 | 0.60 | 1.5 | 50 | 40 |
| Ex. 14 | ETFE | 25 | 590 | 6.6 | 3894 | 8 | 250 | 750 | 0.75 | 1.5 | 50 | 40 |
| Ex. 15 | ETFE | 25 | 590 | 6.6 | 3894 | 5 | 399 | 1197 | 1.20 | 1.5 | 50 | 40 |
| Ex. 16 | ETFE | 25 | 450 | 5.1 | 2295 | 8 | 147 | 441 | 0.75 | 1.5 | 50 | 55 |
| Ex. 17 | ETFE | 25 | 450 | 5.1 | 2295 | 6 | 196 | 588 | 1.00 | 1.5 | 50 | 55 |
| Ex. 18 | ETFE | 25 | 385 | 5.1 | 1386 | 4 | 178 | 534 | 1.50 | 1.5 | 50 | 55 |

TABLE 4

| | Wettability index [dyne] | Fluorine transfer amount (F/Al) | PET laminate test peeling strength [N/cm] | | EVA adhesion test peeling strength [N/cm] | | Total judgment |
| | | | Initial | After test | Initial | After test | |
|---|---|---|---|---|---|---|---|
| Ex. 8 | 34 | 0.22 | — | — | 6.5 | 5.7 | x |
| Ex. 9 | 36 | 0.24 | — | — | 7.8 | 7.4 | ○ |
| Ex. 10 | 38 | 0.24 | — | — | 8.4 | 8.0 | ○ |
| Ex. 11 | 40 | 0.26 | 4.5 | 4.1 | 9.6 | 9.6 | ○ |
| Ex. 12 | 42 | 0.30 | 4.6 | 1.2 | 9.2 | 9.1 | ○ |
| Ex. 13 | 46 | 0.32 | — | — | 9.2 | 9.2 | ○ |
| Ex. 14 | 50 | 0.57 | 4.5 | 3.0 | 9.5 | 6.2 | x |
| Ex. 15 | 54 | 0.65 | — | — | 9.0 | 6.5 | x |
| Ex. 16 | 44 | 0.29 | — | — | 8.7 | 8.4 | ○ |
| Ex. 17 | 46 | 0.42 | — | — | 9.4 | 9.2 | ○ |
| Ex. 18 | 46 | 0.37 | — | — | 8.9 | 8.2 | ○ |

As shown in FIGS. 2 and 3, the ETFE film of Example 8 wherein the total discharge density was less than 220 W·min/m², showed poor adhesion to EVA since introduction of nitrogen functional groups were not sufficiently carried out.

In each of ETFE films of Examples 9 to 13 and 16 to 18 to which glow discharge treatments with a discharge density of from 40 to 200 W·min/m² were carried out in a nitrogen atmosphere having an oxygen concentration of at most 100 ppm with a treatment interval of at least 0.01 second so that the total of discharge densities became 220 to 800 W·min/m², the wettability index became high, the fluorine transfer amount (F/Al) became small, an excellent adhesion to EVA was obtained as compared with the non-treated ETFE film of Example 7, and the adhesion was maintained for a long time. Further, the ETFE films of Examples 11 and 12 after the treatment showed excellent adhesions to a PET film in the laminate test, and the adhesion was maintained for a long time.

In each of the ETFE films of Example 14 and 15 wherein the discharge density in each glow discharge treatment exceeded 200 W·min/m², the fluorine transfer amount (F/Al) became large, and even though the initial adhesion to EVA was excellent, the adhesion was deteriorated by the constant-temperature constant-humidity test. Further, the ETFE film of Example 14 after the treatment was excellent in the initial adhesion in the laminate test with PET film in the same manner as ETFE films of Examples 11 and 12, but the adhesion was deteriorated by the constant-temperature constant-humidity test.

Industrial Applicability

The ETFE molded body obtained by the surface treatment method of the present invention is excellent in adhesion to other members such as plastic sheets or metals or other components such as adhesive agents or printing inks, and the ETFE molded body has an excellent durability capable of maintaining the adhesion for a long time. Accordingly, the ETFE molded body is usable as a wall paper, a surface material of e.g. a kitchen door, a gas range hood, a surface material of a wall panel of e.g. a kitchen, a tube for fuel excellent in barrier property against a gasoline and durability, a surface material of a flexible solar cell to be used instead of a glass, and further, a member for a backseat of a solar cell, or a member for a rubber plug for medical use produced by cure-adhered to a rubber.

This application is a continuation of PCT Application No. PCT/JP2011/051654 filed on Jan. 27, 2011, which is a based upon and claims the benefit of priority from Japanese Patent Application No. 2010-018627 filed on Jan. 29, 2010. The contents of those applications are incorporated herein by reference in its entirety.

REFERENCE SYMBOLS 1, 2: surface treatment apparatus, 10: surface treatment unit, 20: discharge means, 21: high frequency power supply, 22: discharge electrode, 23: opposing electrode, 31, 32: guide roll, 40: ETFE film

What is claimed is:

1. A surface treatment method for a fluororesin molded body, which is a method for treating a surface of a fluororesin molded body containing an ethylene-tetrafluoroethylene copolymer by using a glow discharge generated by a pulsed electric field having a voltage-rising time of at most 10 μsec in a nitrogen atmosphere under a pressure in the vicinity of atmospheric pressure;

which comprises carrying out a plurality of glow discharge treatments at intervals of at least 0.01 sec in a nitrogen atmosphere wherein the oxygen concentration is adjusted to be greater than 0% and at most 100 ppm and wherein, if hydrogen gas or carbon dioxide gas is present in the nitrogen atmosphere, the total amount of the hydrogen gas and the carbon dioxide gas is at most 10 mol% based on 100 mol% of the nitrogen gas, so that the discharge density of each of the glow discharges is from 40 to 200 W·min/m$^2$, and that the total discharge density of the glow discharges is from 220 to 800 W·min/m$^2$.

2. The surface treatment method for a fluororesin molded body according to claim 1, wherein the molar ratio of ethylene/tetrafluoroethylene in the ethylene-tetrafluoroethylene copolymer is from 30/70 to 70/30.

3. The surface treatment method for a fluororesin molded body according to claim 1, wherein the frequency of the pulsed electric field is from 0.5 to 100kHz.

4. The method according to claim 1, wherein said method is a continuous method.

5. The method according to claim 1, wherein, if hydrogen gas or carbon dioxide gas is present in the nitrogen atmosphere, the total amount of the hydrogen gas and the carbon dioxide gas is at most 5 mol% based on 100 mol% of the nitrogen gas.

\* \* \* \* \*